United States Patent
Hwang et al.

(10) Patent No.: US 8,119,448 B2
(45) Date of Patent: Feb. 21, 2012

(54) SEMICONDUCTOR CHIP, WAFER STACK PACKAGE USING THE SAME, AND METHODS OF MANUFACTURING THE SAME

(75) Inventors: Son-Kwan Hwang, Suwon-si (KR); In-Young Lee, Yongin-si (KR); Ho-Jin Lee, Seoul (KR); Dong-Hyeon Jang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 12/817,304

(22) Filed: Jun. 17, 2010

(65) Prior Publication Data

US 2011/0097846 A1  Apr. 28, 2011

(30) Foreign Application Priority Data

Oct. 28, 2009 (KR) .................. 10-2009-0102980

(51) Int. Cl.
*H01L 21/00* (2006.01)

(52) U.S. Cl. ............. 438/107; 438/108; 257/E21.585; 257/E21.499

(58) Field of Classification Search .......... 438/107, 438/108, 109, 675; 257/E21.585, E21.499
See application file for complete search history.

(56) References Cited

U.S. PATENT DOCUMENTS

| | | | | |
|---|---|---|---|---|
| 4,978,639 A * | 12/1990 | Hua et al. | | 438/465 |
| 7,241,675 B2 * | 7/2007 | Savastiouk et al. | | 438/597 |
| 7,507,637 B2 * | 3/2009 | Suh et al. | | 438/458 |
| 7,683,459 B2 * | 3/2010 | Ma et al. | | 257/621 |
| 7,786,008 B2 * | 8/2010 | Do et al. | | 438/667 |
| 7,897,432 B2 * | 3/2011 | Sakaguchi et al. | | 438/106 |
| 7,989,263 B2 * | 8/2011 | Kramer et al. | | 438/108 |
| 2002/0175423 A1 * | 11/2002 | Forbes et al. | | 257/778 |
| 2009/0209063 A1 * | 8/2009 | Lee et al. | | 438/109 |
| 2010/0252935 A1 * | 10/2010 | Lee et al. | | 257/774 |
| 2011/0097846 A1 * | 4/2011 | Hwang et al. | | 438/107 |

FOREIGN PATENT DOCUMENTS

| | | |
|---|---|---|
| JP | 10-223833 | 8/1998 |
| KR | 10-0259081 | 6/2000 |
| KR | 10-0345035 | 7/2002 |
| KR | 10-0548578 | 2/2006 |

\* cited by examiner

*Primary Examiner* — Walter L Lindsay, Jr.
(74) *Attorney, Agent, or Firm* — Harness, Dickey & Pierce, P.L.C.

(57) ABSTRACT

A semiconductor chip comprises a substrate including a front surface and a rear surface, the substrate having a first via hole formed in the front surface and a second via hole formed in the rear surface, a first conductive plug formed on the substrate, the first conductive plug including a first portion formed in the first via hole and a second portion protruding from the front surface of the substrate, and a second conductive plug formed on the first conductive plug, the second conductive plug having a smaller cross-sectional area than the first conductive plug.

12 Claims, 9 Drawing Sheets

SEMICONDUCTOR CHIP, WAFER STACK PACKAGE USING THE SAME, AND METHODS OF MANUFACTURING THE SAME

PRIORITY STATEMENT

This application claims the benefit of priority under 35 U.S.C. §119 from Korean Patent Application No. 10-2009-0102980, filed on Oct. 28, 2009, the contents of which are hereby incorporated herein by reference in its entirety.

BACKGROUND

1. Field

Example embodiments relate to a semiconductor chip, a wafer stack package using the same, and methods of manufacturing the same.

2. Description of Related Art

With the tendency toward a smaller size and multi-functionality of electronic products, semiconductor chips are also becoming more highly integrated and multi-functional. Due to this tendency, multi chip package (MCP) technology, particularly wafer stack package (WSP) technology, in which a plurality of semiconductor chips are packaged into one semiconductor chip, has been developed.

SUMMARY

The present invention provides a semiconductor chip that improves bonding reliability and electrical properties, a wafer stack package using the same, and methods of manufacturing the same.

An example embodiment is directed to a method of manufacturing a semiconductor chip. The method includes forming a first via hole in the front surface of the substrate; forming a first conductive plug in the first via hole using a first conductive material, the first conductive plug including a first portion in the substrate and a second portion protruding from the substrate; forming a second conductive plug on an upper surface of the first conductive plug using a second conductive material, the second conductive plug having a smaller cross-sectional area than the first conductive plug; back-lapping a rear surface of the substrate; and forming a second via hole in the back-lapped rear surface of the substrate, the second via hole aligned with the first via hole.

In an example embodiment, the forming a first via hole step may include forming a first photoresist pattern on the front surface of the substrate, the first photoresist pattern having an opening exposing a portion of the substrate; and removing the exposed portion of the substrate using the first photoresist pattern as an etch mask through a laser drilling method or a dry etching method. The first conductive plug may be formed by at least one of electroplating and electroless plating.

In an example embodiment, the forming the first conductive plug step may include forming a seed layer on the entire front surface of the substrate including the first via hole, the seed layer including at least one of copper (Cu), tungsten (W), gold (Au) and silver (Ag); applying, exposing and developing photoresist on the entire surface of the substrate including the seed layer to form a second photoresist pattern having an opening in the first via hole; performing at least one of electroplating and electroless plating on the substrate with the first conductive material using the seed layer; and removing the second photoresist pattern.

In an example embodiment, the second conductive plug may be formed using the first conductive plug as a seed layer by at least one of electroplating and electroless plating. The forming the second conductive plug step may include applying, exposing and developing photoresist on the front surface of the substrate including the first conductive plug to form a third photoresist pattern having an opening with a smaller cross-sectional area than the first via hole; performing at least one of electroplating and electroless plating on the substrate with the second conductive material using the first conductive plug as a seed layer; and removing the third photoresist pattern.

In an example embodiment, the second conductive plug may be formed by soldering using tin lead (SnPb). The first and second conductive plugs may be formed of the same conductive material, and the first and second conductive materials may include copper (Cu). The first and second conductive plugs may be formed of different conductive materials, the first conductive plug including copper (Cu) and the second conductive plug including one selected from aluminum (Al), tungsten (W), gold (Au), silver (Ag), and tin lead (SnPb).

In an example embodiment, the forming a second via hole step may include applying, exposing and developing photoresist on the rear surface of the back-lapped substrate to form a fourth photoresist pattern having an opening exposing a portion of the substrate and corresponding to the first via hole; and removing the exposed portion of the back-lapped substrate using the fourth photoresist pattern as an etch mask through a laser drilling method or a dry etching method.

An example embodiment is directed to a method of manufacturing a wafer stack package. The method includes forming a first photoresist pattern partially opening a front surface of a substrate, the substrate including an input/output pad; etching the front surface of the substrate using the first photoresist pattern as an etch mask to form a first via hole; removing the first photoresist pattern; forming a metal seed layer on the entire surface of the substrate including the first via hole; applying, exposing and developing photoresist on the front surface of the substrate including the metal seed layer to form a second photoresist pattern having an opening in the first via hole; performing at least one of electroplating and electroless plating on the substrate using the metal seed layer to form a first conductive plug, the first conductive plug including a first portion in the first via hole and the second portion protruding from an upper surface of the substrate; removing the second photoresist pattern; applying, exposing and developing the photoresist on the front surface of the substrate to form a third photoresist pattern having an opening with a smaller cross-sectional area than the first via hole; performing at least one of electroplating and electroless plating using the first conductive plug as a seed layer to form a second conductive plug on the first conductive plug, the second conductive plug having a smaller cross-sectional area than the first conductive plug; removing the third photoresist pattern; back-lapping a rear surface of the substrate; applying, exposing and developing photoresist on the rear surface of the back-lapped substrate to form a fourth photoresist pattern having an opening exposing a portion of the substrate and corresponding to the first via hole; and forming a second via hole by etching the rear surface of the back-lapped substrate using the fourth photoresist pattern as an etch mask, the second via hole aligned with the first via hole.

In an example embodiment, the method may further include cutting the substrate into individual semiconductor chips through a dicing process; and stacking the individual semiconductor chips.

An example embodiment is directed to a semiconductor chip. The semiconductor chip includes a substrate including a front surface and a rear surface, the substrate having a first via hole formed in the front surface and a second via hole formed in the rear surface; a first conductive plug formed on the substrate, the first conductive plug including a first portion formed in the first via hole and a second portion protruding from the front surface of the substrate; and a second conductive plug formed on the first conductive plug, the second conductive plug having a smaller cross-sectional area than the first conductive plug.

In an example embodiment, the sum of a height of the first portion of the first conductive plug and a height of the second conductive plug may be identical to a depth of the second via hole.

An example embodiment is directed to a semiconductor chip. The semiconductor chip includes a substrate including a via hole formed therein; a first conductive plug formed in an upper end of the via hole, a second conductive plug formed in a lower end of the via hole and a third conductive plug formed in the via hole between the first and second conductive plugs.

In an example embodiment, the first and second conductive plugs may be identical in height, and symmetrical with respect to a horizontal axis.

Another example embodiment is directed to a wafer stack package including a lower substrate including a first via hole formed in a front surface thereof; an upper substrate including a second via hole formed in a rear surface thereof, the second via hole aligned with the first via hole; and a via plug formed in the first and second via holes to electrically connect the lower and upper substrates.

In an example embodiment, the via plug may include at least a first conductive plug including a first portion formed in the first via hole and a second portion protruding from the front surface of the lower substrate; and a second conductive plug formed on the first conductive plug, the second conductive plug having a smaller cross-sectional area than the first conductive plug.

In an example embodiment, the second conductive plug and the second portion of the first conductive plug are in the second via hole of the upper substrate so that another first conductive plug in the lower substrate is electrically connected with the second conductive plug of the upper substrate.

Another example embodiment is directed to a semiconductor module including a plurality of semiconductor chips on a module substrate; and a plurality of module contact terminals electrically connected with the plurality of semiconductor chips, wherein at least one of the plurality of semiconductor chips includes a substrate including a front surface and a rear surface, the substrate having a first via hole formed in the front surface and a second via hole formed in the rear surface; a first conductive plug formed on the substrate, the first conductive plug including a first portion formed in the first via hole and a second portion protruding from the front surface of the substrate; and a second conductive plug formed on the first conductive plug, the second conductive plug having a smaller cross-sectional area than the first conductive plug.

BRIEF DESCRIPTION OF THE DRAWINGS

Example embodiments are described in further detail below with reference to the accompanying drawings. It should be understood that various aspects of the drawings may have been exaggerated for clarity.

FIGS. 2A through 2O are longitudinal cross-sectional views illustrating the configuration of a semiconductor chip to explain a process of manufacturing the wafer stack package of FIG. 1.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. The inventive concepts, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concepts are not limited to example embodiments described.

Figure 1:
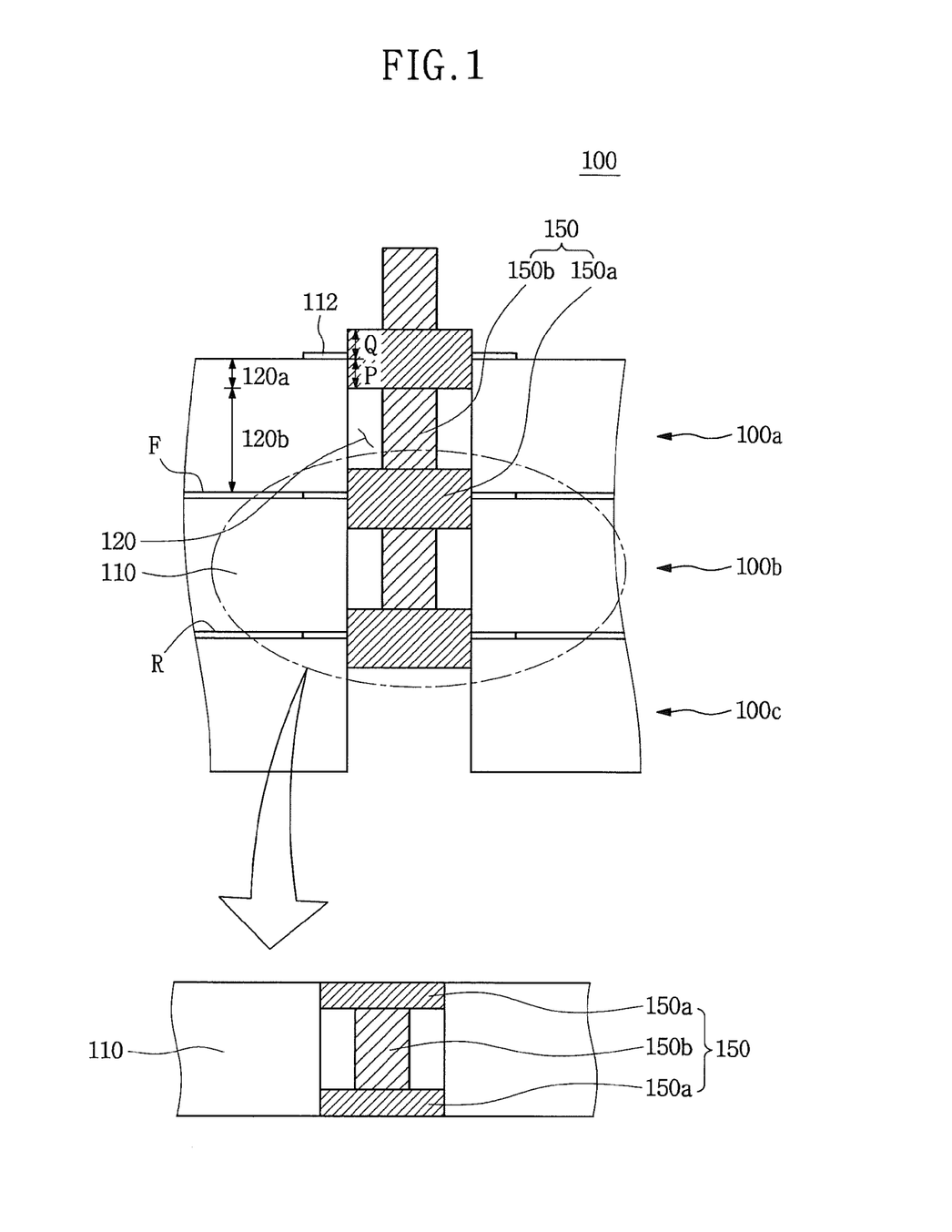
FIG. 1 is a longitudinal cross-sectional view illustrating the configuration of a wafer stack package according to an example embodiment of the inventive concepts.

Example embodiments relate to a semiconductor chip and a wafer stack package using the same. FIG. 1 is a cross-sectional view illustrating the configuration of a wafer stack package according to an example embodiment.

Referring to FIG. 1, a wafer stack package 100 according to an example embodiment may include a via hole 120 passing through a semiconductor substrate 110, and a via plug 150 formed in the via hole 120 such that a plurality of semiconductor chips 100a, 100b and 100c are bonded and electrically connected.

The via hole 120 may include a first via hole 120a formed in a front surface F of the semiconductor substrate 110, and a second via hole 120b formed in a rear surface R of the semiconductor substrate 110. In other words, the first and second via holes 120a and 120b may be formed in the front and rear surfaces F and R of the semiconductor substrate 110, and may be aligned to form the via hole 120. The via hole 120 may be aligned with input and output pads 112, each of which functions as an external terminal.

Herein, the terms "front surface," "rear surface," "upper surface," or "lower surface" are entirely relative terms, and are merely used to easily discriminate a relative position between the elements as illustrated in the figures. It will be apparent that these relative terms are not intended to limit positions and directions of the elements.

The via plug 150 includes a first conductive plug 150a formed in the front surface F of the semiconductor substrate 110, and a second conductive plug 150b formed on the first conductive plug 150a. A lower portion P of the first conductive plug 150a may be located in the first via hole 120a, and the other portion Q, i.e. the upper portion, may protrude from the front surface F of the semiconductor substrate 110. A cross-sectional area of the second conductive plug 150b may be formed to be equal to or less than that of the first conductive plug 150a.

When the cross-sectional area of the second conductive plug 150b is formed to be less than that of the first conductive plug 150a, inserting the second conductive plug 150b into the second via hole 120b is easier when the semiconductor chips 100a, 100b and 100c are vertically stacked, and a space is formed around the second conductive plug 150b, thereby leaving room for expansion of the second conductive plug 150b in a horizontal direction even when pressure is applied to the second conductive plug 150b in a vertical direction.

A height of the lower portion P of the first conductive plug 150a may be exactly identical to a depth of the first via hole 120a. However, the sum of a height of the upper portion Q of the first conductive plug 150a and a height of the second conductive plug 150b may be identical to or slightly greater than a depth of the second via hole 120b.

The first and second conductive plugs 150a and 150b may be formed of different materials or the same material having electrical conductivity. For example, the first and second conductive plugs 150a and 150b may both be formed of copper (Cu). The first conductive plug 150a may be formed of Cu, and the second conductive plug 150b may be formed of tin lead (SnPb).

When the semiconductor substrate 110 is cut into the individual semiconductor chips 100a, 100b and 100c, and the semiconductor chips 100a, 100b and 100c are stacked into the wafer stack package 100, the entire second conductive plug 150b provided on the front surface F of the lower semiconductor chip 100c or 100b and the upper portion Q of the first conductive plug 150a are inserted into the second via hole 120b formed in the rear surface R of the upper semiconductor chip 100b or 100a. Thus, the second conductive plug 150b is confined within the semiconductor substrate 110 by the first conductive plug 150a.

For example, considering the via plug 150 with reference to the via hole 120 in the wafer stack package 100, the second conductive plug 150b may be interposed between the portions P and Q of the first conductive plug 150a located at upper and lower ends of the via hole 120 respectively, and may be formed in a structure in which the second conductive plug 150b is confined within the via hole 120. When the lower portion P of the first conductive plug 150a has the same height as the upper portion Q of the first conductive plug 150a, the via plug 150 may be formed in a structure that is symmetrical with respect to a horizontal axis. In contrast, when the lower portion P of the first conductive plug 150a is higher or lower than the upper portion Q of the first conductive plug 150a, the via plug 150 may be formed in a structure that is asymmetrical with respect to a horizontal axis.

Hereinafter, a method of manufacturing the semiconductor chip having the aforementioned configuration and a method of manufacturing the wafer stack package using the same will be described in detail with reference to the accompanying drawings.

Figure 2A:
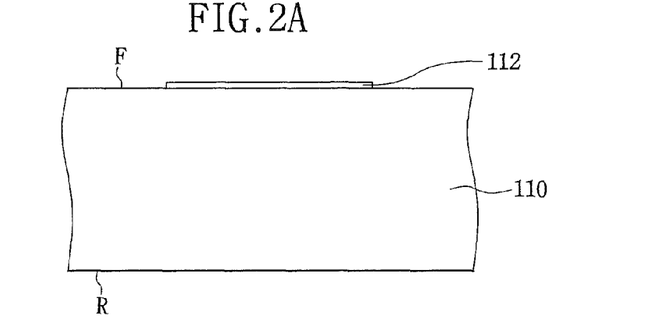

FIGS. 2A through 2O are cross-sectional views for explaining processes of manufacturing a semiconductor chip and stacking the manufactured semiconductor chips to manufacture a wafer stack package.

Referring to FIG. 2A, a semiconductor substrate 110 may be processed consistent with characteristics of a semiconductor chip to be manufactured. This wafer manufacturing process is already well-known, and thus, a detailed description thereof will be omitted herefrom.

For example, the semiconductor substrate 110 may include a silicon-on-insulator (SOI) substrate, a gallium arsenic (GaAs) substrate, a germanium (Ge) substrate, etc. in addition to a typical silicon (Si) substrate. The semiconductor substrate 110 may include various active or passive elements mounted thereon depending on the characteristics of the semiconductor chip. Here, the semiconductor substrate 110 will be a Si substrate in which the chip forming process is completed.

As an example, the semiconductor chip may include a memory device such as a dynamic random access memory (DRAM) or a flash memory, as well as a non-memory device such as a logic chip or a CPU chip. In the case of the memory device, both a mixture of only homogeneous memory devices and a mixture of heterogeneous memory devices may be included. An input/output pad 112 may be formed on the semiconductor substrate 110. The input/output pad 112 may be formed of aluminum (Al), tungsten (W), or an alloy thereof.

Figure 2B:
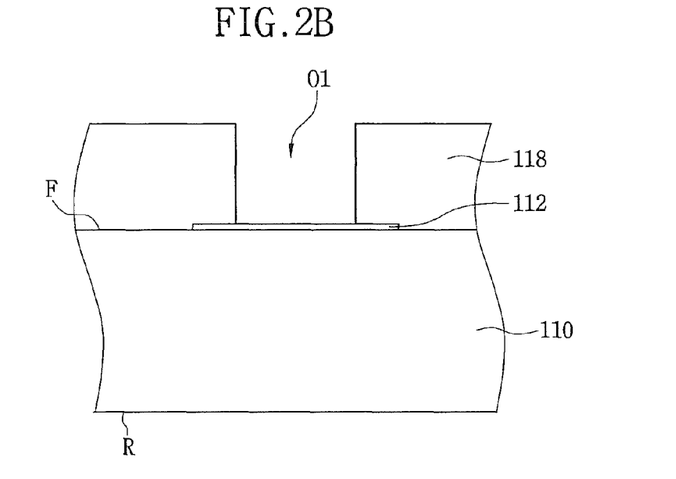

Referring to FIG. 2B, a photoresist is applied to the front surface F of the semiconductor substrate 110, and is subjected to exposure and development processes. Thereby, an upper surface of the input/output pad 112 is partially exposed to form a first opening O1. Thus, a first photoresist pattern 118 having the first opening O1 is formed.

Figure 2C:
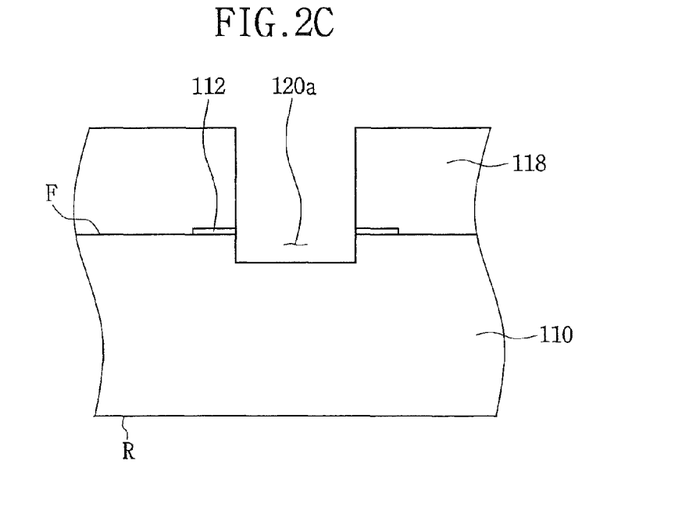

Referring to FIG. 2C, a first via hole 120a is formed in the semiconductor substrate 110. As a method of forming the via hole 120a, a laser drilling method, a wet etching method, or a dry etching method may be used. In this example embodiment, the dry etching method may be used. This dry etching method may include reactive ion etching (RIB), magnetically enhanced reactive ion etching (MERIE), chemical downstream etching (CDE), electron cyclotron resonance (ECR), transformer coupled plasma (TCP), etc.

Referring again to FIG. 2C, the input/output pad 112 and the semiconductor substrate 110 are etched using the first photoresist pattern 118 as an etch mask. Thereby, the first via hole 120a is formed.

Figure 2D:
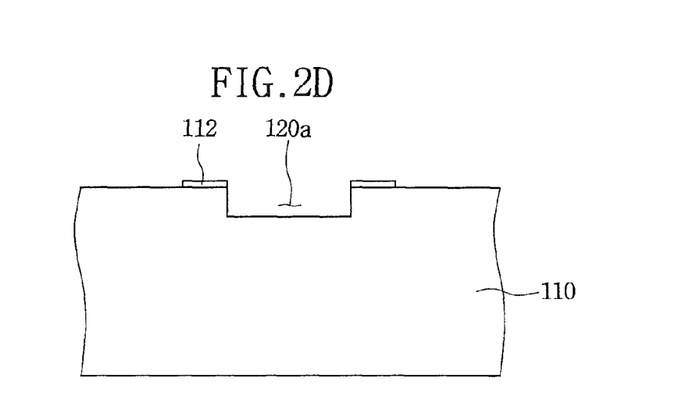

Referring to FIG. 2D, the first photoresist pattern 118 is removed. The first via hole 120a forms a via hole 120 passing through the semiconductor substrate 110 along with a second via hole 120b which will be described below. A depth of the first via hole 120a may be smaller than a thickness of the semiconductor substrate 110.

The first via hole 120a may be directly formed in the center of the input/output pad 112 as illustrated in the figures, but example embodiments are not limited thereto. For example, the first via hole 120a may be spaced apart from the input/output pad 112 by a predetermined or given distance, and a via plug (not shown) may be connected with the input/output pad 112 by re-metallization.

Figure 2E:
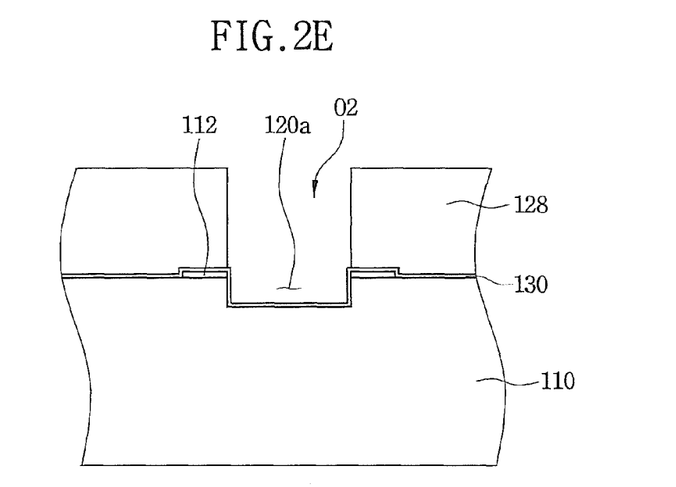
Figure 2F:
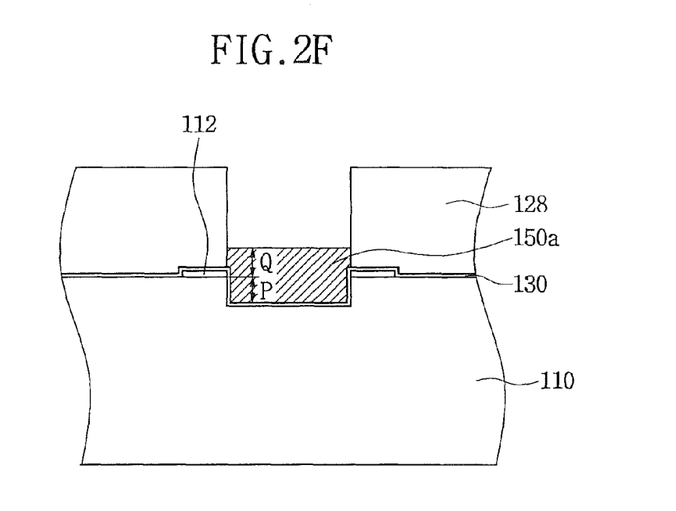

The first via hole 120a may be partially filled with a first conductive material such as copper (Cu), aluminum (Al) or tungsten (W), so that a first conductive plug 150a is formed (see FIG. 2F). Among the first conductive materials, copper (Cu) having a lower specific resistance may be used. Tungsten may be filled by deposition, and Cu may be filled by electroplating.

Referring to FIG. 2E, the photoresist is applied again to the front surface F of the semiconductor substrate 110 having the first via hole 120a, and is subjected to exposure and development processes. Thereby, a second photoresist pattern 128 having a second opening O2 is fanned. The second photoresist pattern 128 is used as a plating mask for at least one of electroplating and electroless plating rather than as an etch mask.

Referring again to FIG. 2E, before the photoresist is applied, a seed layer 130 may be formed on an inner surface of the first via hole 120a by, for instance, physical vapor deposition (PVD) in which a metal such as Cu, W, Au, or Ag is deposited on the entire semiconductor substrate 110 having the first via hole 120a. By using the seed layer 130, Cu may be formed on the semiconductor substrate 110, and it may be difficult to distinguish the material of the seed layer 130 from Cu or the other first conductive material. However, when the metal, for example, Cu, is deposited on the entire semiconductor substrate 110 using, for example, PVD, the seed layer 130 may be formed relatively thin at least on sidewalls and a bottom of the first via hole 120a.

Although not illustrated, to prevent or reduce Cu from being diffused into the semiconductor substrate 110, a barrier layer may be formed on the sidewalls of the first via hole 120a using a titanium or titanium nitride layer, a tantalum or tantalum nitride layer, or the like before the seed layer 130 is formed. Hereinafter, the seed layer 130 is not shown in the figures because it is difficult to distinguish the seed layer 130 from the first conductive plug 150a.

Referring to FIG. 2F, the first conductive plug 150a is formed in the first via hole 120a at a desired height by properly setting a plating stop time. A technique used for selecting and detecting a plating process time in a plating process is well-known, and so detailed description thereof will be omitted herefrom.

However, the level of an upper portion Q of the first conductive plug 150a may be at least higher than the level of an upper surface of the semiconductor substrate 110. The upper portion Q of the first conductive plug 150a which protrudes from the upper surface of the semiconductor substrate 110 is inserted into the via hole 120 of another semiconductor substrate 110 to be stacked on the semiconductor substrate 110.

When the upper portion Q of the first conductive plug 150a which protrudes from the upper surface of the semiconductor substrate 110 has the same height as a lower portion P of the first conductive plug 150a which is embedded in the first via hole 120a, a pair of first conductive plugs 150a formed up and down in the respective semiconductor substrates are identical in height to each other, and thus may be symmetrical with respect to a horizontal axis. In contrast, when the upper portion Q of the first conductive plug 150a which protrudes from the upper surface of the semiconductor substrate 110 is higher than the lower portion P of the first conductive plug 150a formed in the first via hole 120a, one of the first conductive plugs 150a which is located in a lower portion of the via hole 120 is relatively longer than the other, and thus may be asymmetrical with respect to a horizontal axis.

Figure 2G:
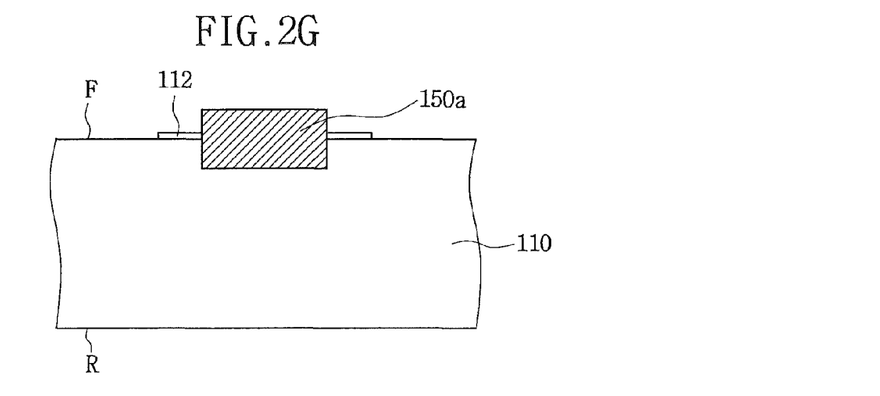

Referring to FIG. 2G, the second photoresist pattern 128 may be removed. At this time, the seed layer 130 excluding the first conductive plug 150a may be easily removed using a wet etching method.

Figure 2H:
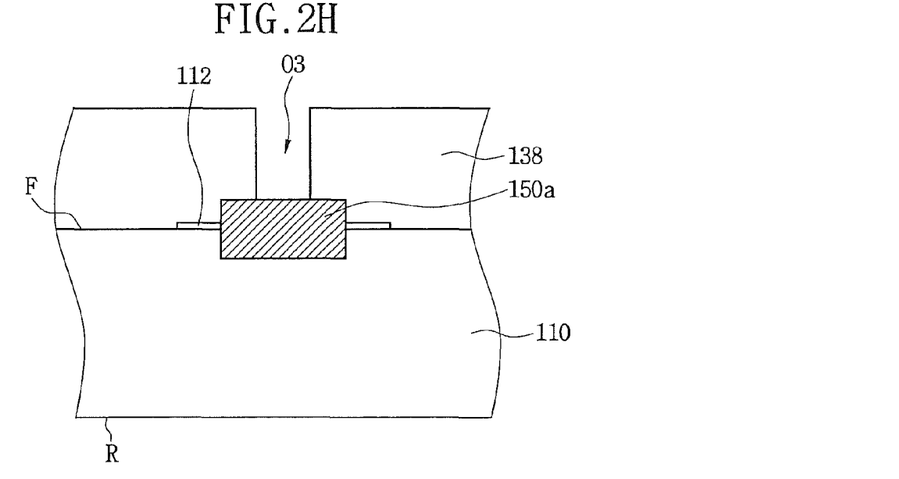

Referring to FIG. 2H, the photoresist is applied to the front surface F of the semiconductor substrate 110 having the first conductive plug 150a, and then is subjected to exposure and development processes. Thereby, a third photoresist pattern 138 having a third opening O3 is formed. Here, in terms of size, the third opening O3 of the third photoresist pattern 138 must be equal to or less than the second opening O2 of the second photoresist pattern 128.

Figure 2I:
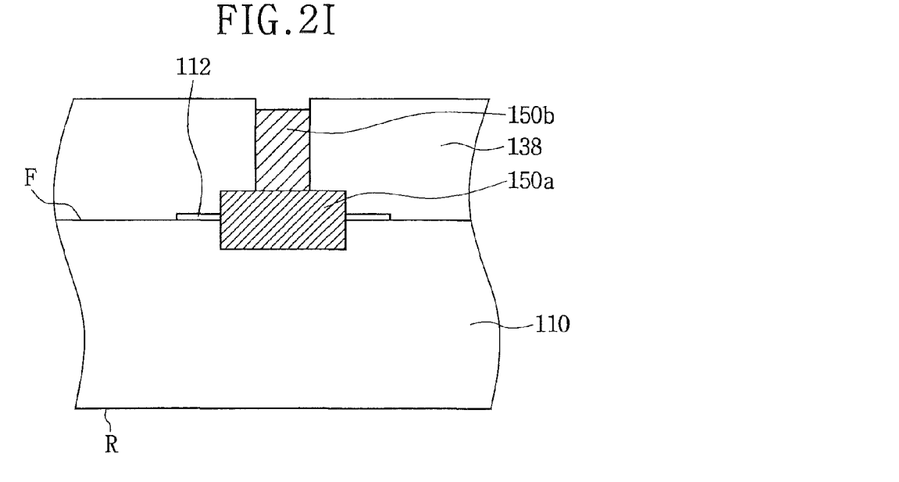

Referring to FIG. 2I, at least one of electroplating and electroless plating is carried out using the third photoresist pattern 138 as a plating mask. Thereby, a second conductive plug 150b may be formed. However, since the second conductive plug 150b may be plated using the first conductive plug 150a as a seed, a separate seed layer may not be formed. In this manner, the third opening O3 is filled with a second conductive material such as Cu, Al, or SnPb. Thereby, the second conductive plug 150b may be formed.

Particularly, SnPb may be soldered through a soldering process in addition to the electroplating process. The soldering process may be performed in such a manner that a conductor is covered by an ink jet or squeezing method.

Figure 2J:
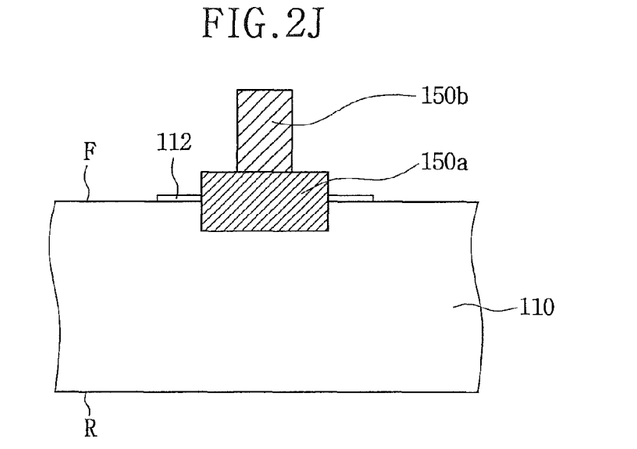

Referring to FIG. 2J, the third photoresist pattern 138 may be removed. When the third photoresist pattern 138 is removed, a structure in which the second conductive plug 150b is stacked on the first conductive plug 150a is obtained.

Figure 2K:
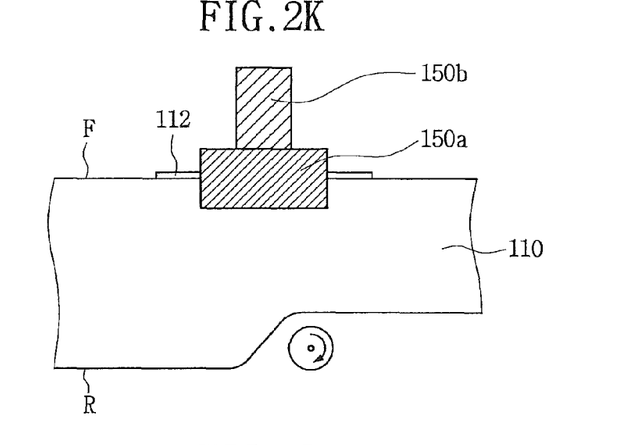

Referring to FIG. 2K, the rear surface R of the semiconductor substrate 110 is processed at a uniform thickness using a back-lapping process. To form the semiconductor substrate 110 to a thickness suitable for packaging, the rear surface R, i.e. the inactive surface, of the semiconductor substrate 110 is ground. Here, although not illustrated, to protect the active surface of the semiconductor substrate 110 and prevent or reduce the semiconductor substrate 110 from being warped, a protective layer may be formed on the front surface F of the semiconductor substrate 110 and removed after the back-lapping process.

Figure 2L:
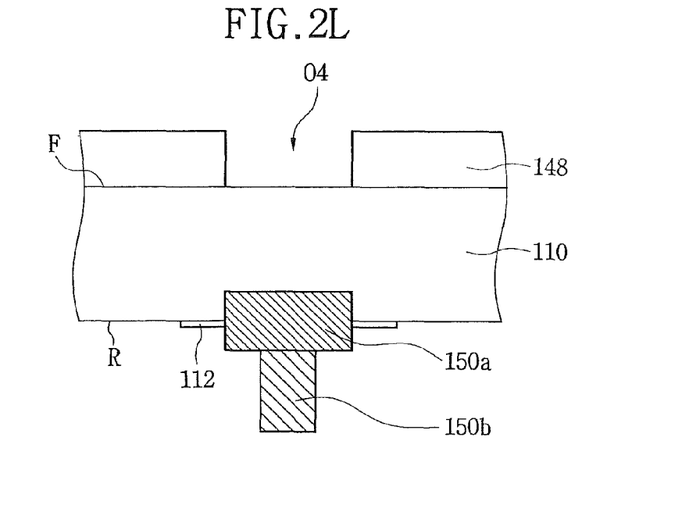

Referring to FIG. 2L, the photoresist is applied to the rear surface R of the semiconductor substrate 110 while the semiconductor substrate 110 is upside down, and is subjected to exposure and development processes. Thereby, a fourth photoresist pattern 148 having a fourth opening O4 is formed. The fourth opening O4 of the fourth photoresist pattern 148 may have the same size as the first opening O1 of FIG. 3b. Similar to the first via hole 120a, the second via hole 120b may be formed using a laser drilling method, a wet etching method, a dry etching method, or the like. Among these methods, a RIE dry etching method may be used.

Figure 2M:
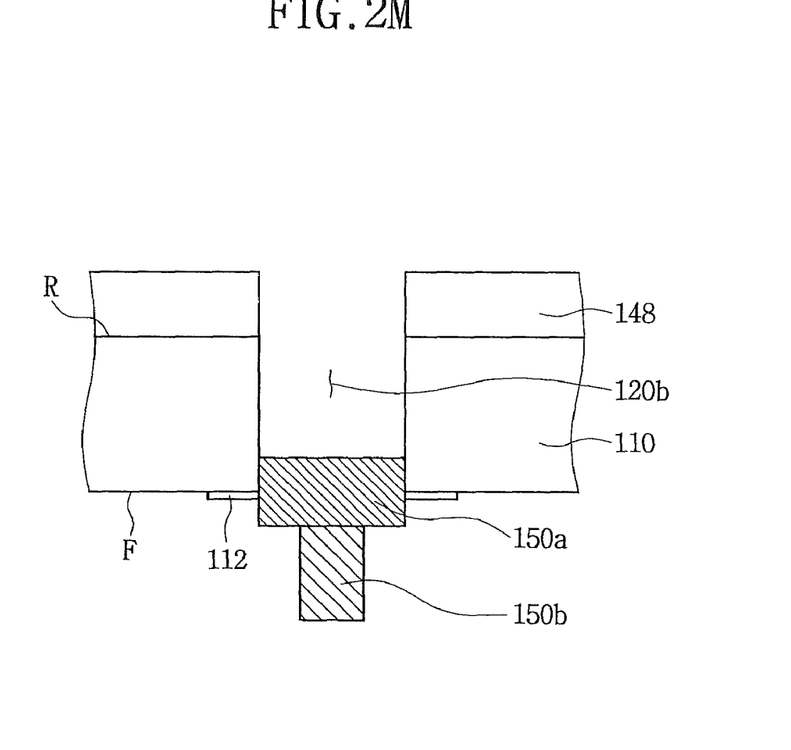

Referring to FIG. 2M, the rear surface R of the semiconductor substrate 110 is etched using the RIE dry etching method. The first conductive plug 150a functions as an etch stop layer, and the etching is stopped on the rear surface R of the first conductive plug 150a. A second via hole 120b communicating with the first via hole 120a may be formed.

Figure 2N:
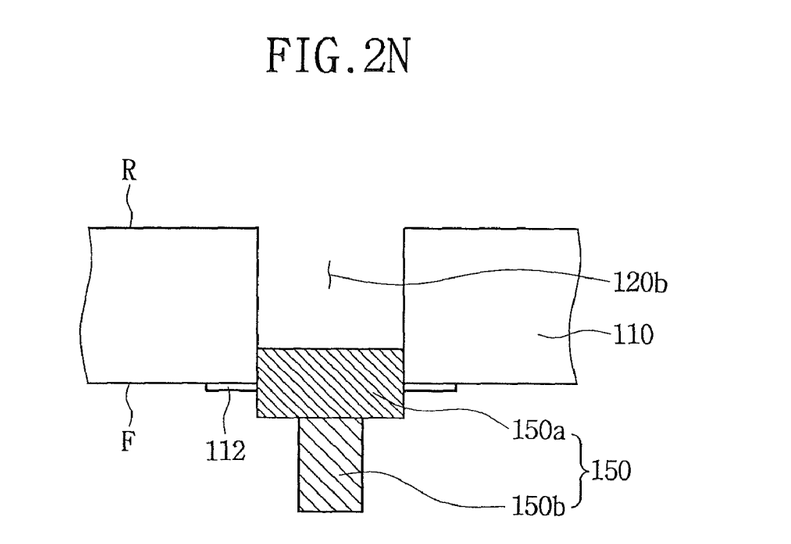

Referring to FIG. 2N, the fourth photoresist pattern 148 may be removed. The first and second conductive plugs 150a and 150b are formed as a via plug 150. In this manner, the first and second conductive plugs 150a and 150b serve to electrically connect the individual semiconductor chips 100a, 100b and 100c as shown in FIG. 2O in a vertical direction, and may be formed in the semiconductor substrate 110.

As illustrated in FIG. 2O, the semiconductor substrate 110 is cut into the individual semiconductor chips 100a, 100b and 100c through a dicing process. The individual semiconductor chips 100a, 100b and 100c may be vertically stacked to form the wafer stack package 100. For example, the second conductive plug 150b protruding from the front face F of one semiconductor chip 100c of the semiconductor chips 100a, 100b and 100c is mounted into the second via hole 120b formed in the rear surface R of another semiconductor chip 100b, and is contacted with the first conductive plug 150a of the other 100b. In this way, these semiconductor chips 100a, 100b and 100c may be vertically stacked and electrically connected.

In addition, the wafer stack package 100 may be formed by stacking the wafers and cutting the stacked wafers at a wafer level. In another method, the wafer stack package 100 may be formed by cutting the wafer into semiconductor chips through a dicing process, and stacking the semiconductor chips.

Figure 3:
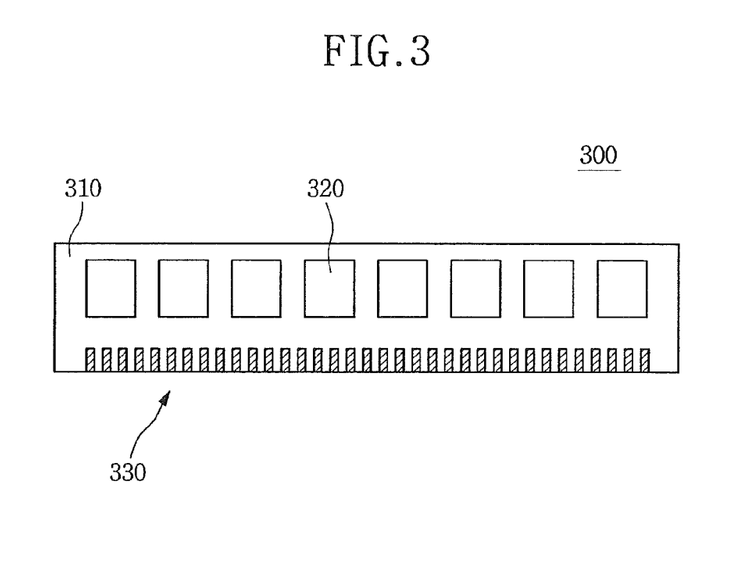
FIG. 3 is a schematic plan view of a semiconductor module including a wafer stack package according to an example embodiment of the inventive concepts.

FIG. 3 is a schematic plan view of a semiconductor module having semiconductor chips according to an example embodiment of the inventive concepts. Referring to FIG. 3, a semiconductor module 300 according to an example embodiment of the inventive concepts includes a module substrate 310, a plurality of semiconductor chips 320 disposed on the module substrate 310, and a plurality of module contact terminals 330 formed in parallel on an edge of the module substrate 310 and electrically connected with the semiconductor chips 320.

The module substrate 310 may be a printed circuit board (PCB). Both sides of the module substrate 310 may be used. In FIG. 3, the eight semiconductor chips 320 are disposed on the front side of the module substrate 310, however this disposition is merely illustrative. In general, one semiconductor module includes eight semiconductor chips, or may further include a separate semiconductor chip or package for controlling the semiconductor chips 320.

At least one of the semiconductor chips 320 may serve as at least one of the semiconductor chips 100a, 100b and 100c or the wafer stack package 100 according to an example embodiment of the inventive concepts.

Figure 4:
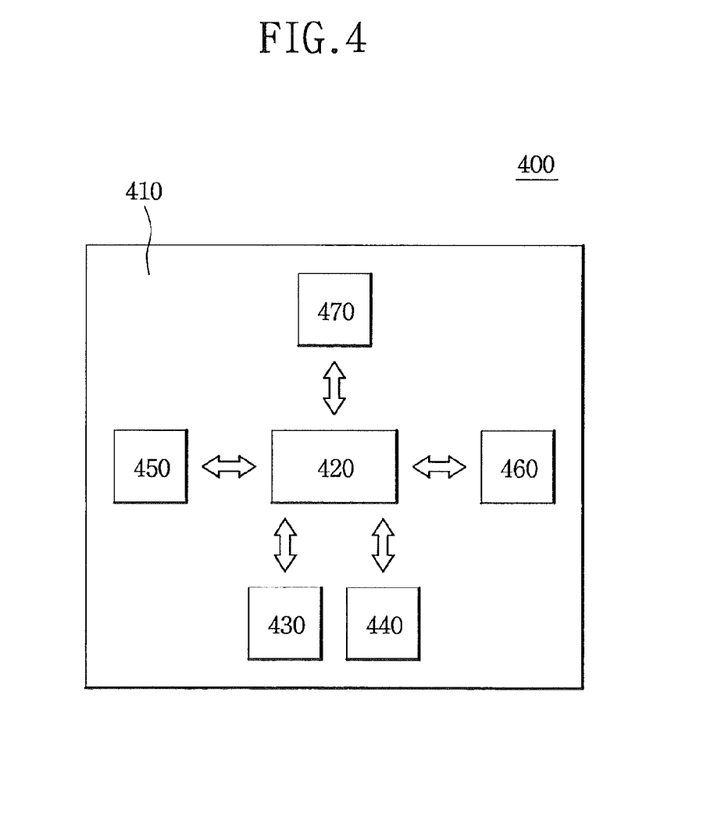
FIG. 4 is a schematic block diagram of an electronic circuit board including a wafer stack package according to an example embodiment of the inventive concepts.

FIG. 4 is a schematic block diagram of an electronic circuit board according to an example embodiment of the inventive concepts. Referring to FIG. 4, an electronic circuit board 400 according to an example embodiment of the inventive concepts includes a microprocessor 420 disposed on a circuit board 410, main and supplementary storage circuits 430 and 440 communicating with the microprocessor 420, an input signal processing circuit 450 sending an instruction to the microprocessor 420, an output signal processing circuit 460 receiving an instruction from the microprocessor 420, and a communicating signal processing circuit 470 sending and receiving an electric signal to and from other circuit boards. Each arrow refers to a path through which an electric signal can be transferred.

The circuit board 410, the microprocessor 420, the main storage circuit 430, the supplementary storage circuit 440, the input signal processing circuit 450, the output signal processing circuit 460, and/or the communicating signal processing circuit 470 may include at least one of the semiconductor chips 100a, 100b and 100c, the wafer stack package 100, or the semiconductor module 300 according to an example embodiment of the inventive concepts.

Figure 5:
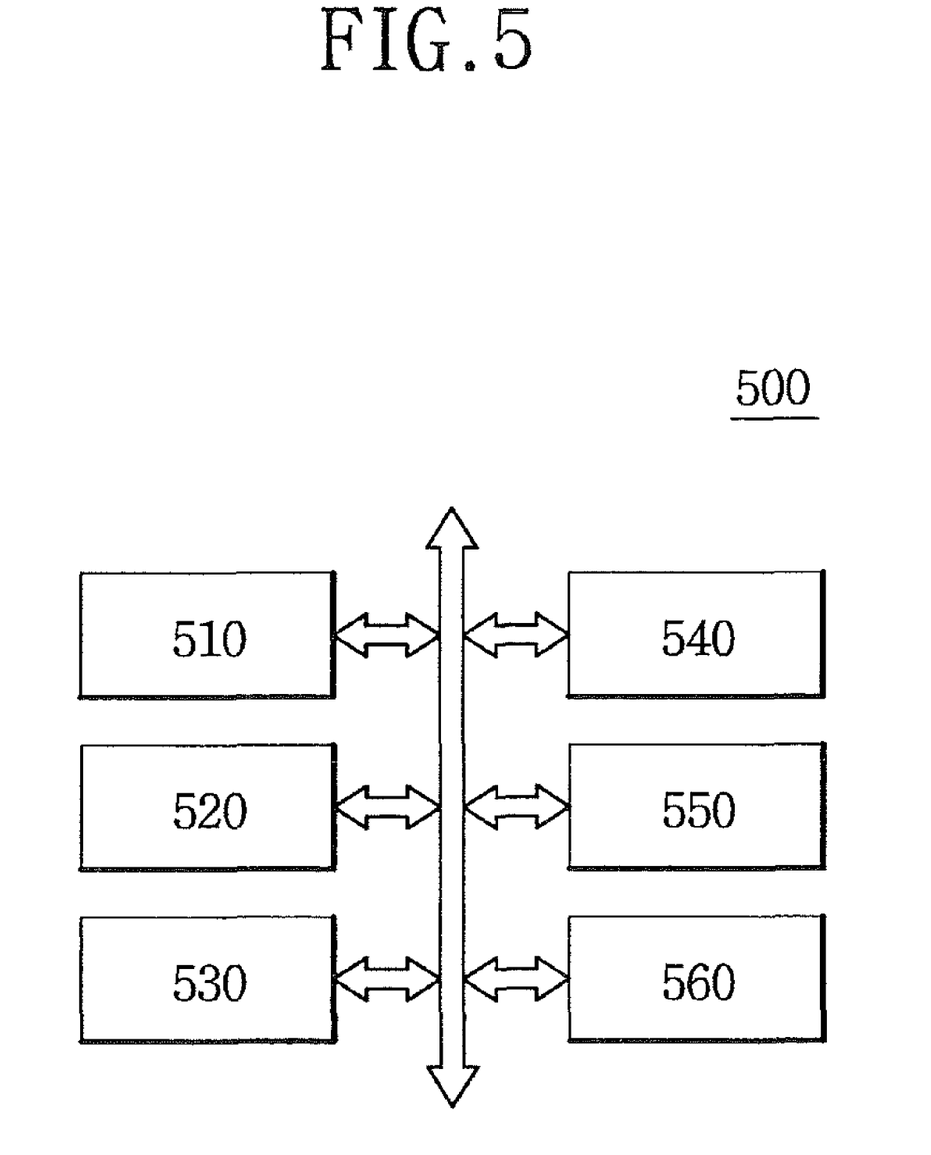
FIG. 5 is a schematic block diagram of an electronic system including a wafer stack package according to an example embodiment of the inventive concepts.

FIG. 5 is a schematic block diagram of an electronic system according to an example embodiment of the inventive concepts. Referring to FIG. 5, an electronic system 500 according to an example embodiment of the inventive concepts includes a control unit 510 controlling all units of the electronic system 500 en bloc, an input unit 520 sending an electrical instruction signal to the control unit 510, an output unit 530 receiving an electrical instruction signal from the control unit 510 and outputting a result processed by the electronic system 500, and a storage unit 540 temporarily or permanently storing an electric signal that is to be processed or has been processed by the control unit 510. Further, the electronic system may further include a communication unit 550 receiving the electrical instruction signal from the control unit 510 and sending or receiving an electric signal to or from another electronic system, and/or an operation unit 560 performing physical or mechanical operation according to instruction of the control unit 510.

The control unit 510, the input unit 520, the output unit 530, the storage unit 540, the communication unit 550 and/or the operation unit 560 may include at least one of the semiconductor chips 100a, 100b and 100c, the wafer stack package 100, or the semiconductor module 300 according to an example embodiment of the inventive concepts.

The electronic system according to an example embodiment of the inventive concepts may be one selected from a computer, a network server, a networking printer or scanner, a wireless controller, a mobile communication terminal, an exchange system and/or an electronic device performing a programmed operation.

As described above, according to example embodiments, the electrical properties of a semiconductor chip can be improved, and the bonding reliability of the semiconductor chip can be enhanced.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor chip, comprising:
   forming a first via hole in a front surface of a substrate;
   forming a first conductive plug in the first via hole using a first conductive material, the first conductive plug including a first portion in the substrate and a second portion protruding from the substrate;
   forming a second conductive plug on an upper surface of the first conductive plug using a second conductive material, the second conductive plug having a smaller cross-sectional area than the first conductive plug;
   back-lapping a rear surface of the substrate; and
   forming a second via hole in the back-lapped rear surface of the substrate, the second via hole aligned with the first via hole.

2. The method according to claim 1, wherein the forming the first via hole step includes:
   forming a first photoresist pattern on the front surface of the substrate, the first photoresist pattern having an opening exposing a portion of the substrate; and
   removing the exposed portion of the substrate using the first photoresist pattern as an etch mask through a laser drilling method or a dry etching method.

3. The method according to claim 1, wherein the first conductive plug is formed by at least one of electroplating and electroless plating.

4. The method according to claim 3, wherein the forming the first conductive plug step includes:
   forming a seed layer on the entire front surface of the substrate including the first via hole, the seed layer including at least one of copper (Cu), tungsten (W), gold (Au) and silver (Ag);
   applying, exposing and developing photoresist on the entire surface of the substrate including the seed layer to form a second photoresist pattern having an opening in the first via hole;
   performing at least one of electroplating and electroless plating on the substrate with the first conductive material using the seed layer; and
   removing the second photoresist pattern.

5. The method according to claim 1, wherein the second conductive plug is formed using the first conductive plug as a seed layer by at least one of electroplating and electroless plating.

6. The method according to claim 5, wherein the forming the second conductive plug step includes:
   applying, exposing and developing photoresist on the front surface of the substrate including the first conductive plug to form a third photoresist pattern having an opening with a smaller cross-sectional area than the first via hole;
   performing at least one of electroplating and electroless plating on the substrate with the second conductive material using the first conductive plug as a seed layer; and
   removing the third photoresist pattern.

7. The method according to claim 1, wherein the second conductive plug is formed by soldering using tin lead (SnPb).

8. The method according to claim 1, wherein the first and second conductive plugs are formed of the same conductive material, and the first and second conductive materials include copper (Cu).

9. The method according to claim 1, wherein the first and second conductive plugs are formed of different conductive materials,
   the first conductive plug including copper (Cu) and the second conductive plug including one selected from aluminum (Al), tungsten (W), gold (Au), silver (Ag), and tin lead (SnPb).

10. The method according to claim 1, wherein the forming the second via hole step includes:
    applying, exposing and developing photoresist on the rear surface of the back-lapped substrate to form a fourth photoresist pattern having an opening exposing a portion of the back-lapped substrate and corresponding to the first via hole; and
    removing the exposed portion of the back-lapped substrate using the fourth photoresist pattern as an etch mask through a laser drilling method or a dry etching method.

11. A method of manufacturing a wafer stack package, comprising:
    forming a first photoresist pattern partially opening a front surface of a substrate, the substrate including an input/output pad;
    forming a first via hole using the first photoresist pattern as an etch mask;
    removing the first photoresist pattern;
    forming a metal seed layer on the entire surface of the substrate including the first via hole;
    applying, exposing and developing photoresist on the front surface of the substrate including the metal seed layer to form a second photoresist pattern having an opening in the first via hole and exposing a portion of the substrate;

performing at least one of electroplating and electroless plating on the substrate using the metal seed layer to form a first conductive plug, the first conductive plug including a first portion in the first via hole and the second portion protruding from an upper surface of the substrate;

removing the second photoresist pattern;

applying, exposing and developing the photoresist on the front surface of the substrate to form a third photoresist pattern having an opening with a smaller cross-sectional area than the first via hole and exposing a portion of the substrate;

performing at least one of electroplating and electroless plating using the first conductive plug as a seed layer to form a second conductive plug on the first conductive plug, the second conductive plug having a smaller cross-sectional area than the first conductive plug;

removing the third photoresist pattern;

back-lapping a rear surface of the substrate;

applying, exposing and developing photoresist on the rear surface of the back-lapped substrate to form a fourth photoresist pattern having an opening corresponding to the first via hole and exposing a portion of the substrate; and forming a second via hole in the substrate using the fourth photoresist pattern as an etch mask, the second via hole aligned with the first via hole.

12. The method according to claim 11, further comprising:

cutting the substrate into individual semiconductor chips through a dicing process; and stacking the individual semiconductor chips.

\* \* \* \* \*